United States Patent [19]

Komatsu

[11] Patent Number: 4,887,139
[45] Date of Patent: Dec. 12, 1989

[54] LINEAR PHOTO SENSING DEVICE

[75] Inventor: Kenichi Komatsu, Tochigi, Japan

[73] Assignee: Kabushiki Kaisha Toshiba, Kawasaki, Japan

[21] Appl. No.: 134,061

[22] Filed: Dec. 17, 1987

[30] Foreign Application Priority Data

Dec. 18, 1986 [JP] Japan ................................ 61-299863

[51] Int. Cl.$^4$ ...................... H01L 27/14; H01L 31/00; H04N 3/14; H04N 5/335
[52] U.S. Cl. ................................. 357/30; 358/213.11; 358/213.19
[58] Field of Search ................ 257/30 R; 358/213.11, 358/213.19

[56] References Cited

U.S. PATENT DOCUMENTS 4,679,089 7/1987 Kato .................................. 357/30 Q Primary Examiner—Eugene R. LaRoche
Assistant Examiner—Michael Shingleton
Attorney, Agent, or Firm—Finnegan, Henderson, Farabow, Garrett and Dunner

[57] ABSTRACT

A linear photo sensing device comprises a first electrode section with a plurality of electrode elements linearly arrayed, a second linear electrode section, a linear semiconductor layer with photo-electric converting function sandwiched between the first and second electrode sections, and a third electrode section with a plurality of electrode elements each of which is disposed between the adjacent electrode elements of said first electrode section and which are held at a predetermined potential.

4 Claims, 5 Drawing Sheets

LINEAR PHOTO SENSING DEVICE

BACKGROUND OF THE INVENTION

This invention relates to a linear photo sensing device including a first electrode section with discrete multichannel electrodes linearly arrayed, a linear electrode section, and a photo-electric converting semiconductor layer sandwiched between those electrode sections.

The linear photo sensing device is used with an X-ray radiography system of the type in which an imaging plate as a stimulable phosphor plate, for example, is used. The device reads out the X-ray image data as stored in the imaging plate in the form of latent image.

An accelerated phosphorescence detector is structured as shown in FIG. 1. As shown, imaging plate 1 is placed between stimulating ray source 2 and linear photo sensing device 3, which are oppositely disposed, and is movable in the Y direction. One of the major surfaces, which is denoted as 1a, and stores the radiation energy as a latent image, is irradiated with the stimulating rays, usually laser beams, emitted from stimulating ray source 2. Upon the irradiation, the accelerated phosphorescence is emitted from the other major surface 1 of imaging plate 1, and is sensed by linear photo sensing device 3. The stimulating rays and linear photo sensing device 3 cooperate to scan imaging plate in the X direction. The relative movement of simulating ray source 2 and linear photo sensing device 3, to imaging plate 1 makes the scanning in the Y direction. The light beam sensed by linear photo sensing device 3 is converted into the electrical signal, and processed into the image data corresponding to the latent image, stored, and displayed or recorded in a film (e.g., a photographing film or an X-ray film).

Specifically, the size of imaging plate 1 is 400mm×400mm, and the optical image data as collected by linear photo sensing device 3 is processed into the electrical image data of 2,000×2,000 pixels (picture elements). The pixels of "n", Px1, Px2, Px3,... Pxn which are linearly arrayed in the X direction as shown in FIG. 2, are substantially simultaneously read out through the scanning of it by the combination of stimulating ray source 2 and linear photo sensing device 3. Then, the combination of the light source 2 and the sensing device 3, and imaging plate 1 are successively shifted "n" times in the Y direction orthogonal to the X direction, to scan all of the pixels. To obtain the image data of 2,000×2,000 pixels, n=2,000.

Linear photo sensing device 3 is disposed facing stimulating ray source 2. Structurally, the device 3 contains sensing elements E1, E2, E3,... En (n=2,000) of 2,000 channels, which correspond to 2,000 pixels as the total number of pixels of one linear scanning of X direction on image plate 1. This is clearly illustrated in FIG. 3. The surface 1a of imaging plate 1 is irradiated with the linear stimulating rays, and the surface 1b emits rays of light. The emitted rays are sensed and detected by linear photo sensing device 3, with the resolution of 2,000 pixels.

In the relative movement of the light source 2 and the sensing device 3 to imaging plate 1, the light source 2 and linear photo, sensing device 3 are fixed together, and imaging plate 1 is moved in the direction Y.

The linear photo sensing device 3 shown in FIG. 3 is composed of first electrode 5, amorphous silicon layer 6, and second electrode 7. The first electrode 5 includes electrode elements 5(1), 5(2), 5(3),... 5(n) (n=2,000), a semiconductor layer 6 with the photoelectric converting function covering the surface of first electrode 5, such as amorphous silicon, and a second electrode 7 as a transparent conductive layer and covering the surface of amorphous silicon 6.

The length L of the sensing device 3 is 400mm, corresponding to the X-directional length of imaging plate 1. The size of each electrode element of first electrode 5 is determined allowing for these figures of 400mm and 2,000 pixels. For example, the pitch P of each electrode element is 180 μm, and the length S of each electrode element is 120 μm. Hence, the electrode element interval is 60 μm.

The light rays emitted from the surface 1b of imaging plate 1 are applied to the second electrode 7, and are converted into the corresponding electrical current signal by amorphous silicon layer 6. The signal current is output to first electrode section 5 right under the light irradiation location. In this way, the image light rays emitted from the surface 1a of imaging plate 1 are sensed and detected.

With the structure of electrode elements arrayed at 60 μm intervals, the current which should be directed to the intended element may flow into the elements adjacent to the intended element, via amorphous silicon 6. This results in the cross talk of the detected signal.

To cope with this problem, it is ideal that first electrode 5, amorphous silicon layer 6, and second electrode 7 are separately formed, to form separate sensing elements of 2,000 channels, as shown in FIG. 4. At the present stage of the photolithography technology, it is very difficult to make the patterning of three layers with satisfactorily high accuracy in the order of 10 μm. Particularly the aligning of the mask of each layer is very difficult. Therefore, it is almost impossible to manufacture the linear photo sensing device as shown in FIG. 4.

SUMMARY OF THE INVENTION

Accordingly, an object of this invention is to provide a linear photo sensing device which can be fabricated with the patterning with the accuracy allowed in the present fabricating technology, effectively preventing the cross talk problem.

A linear photo sensing device according to this invention contains a first electrode section with multichannel electrode elements, and a third electrode section with a plurality of electrode elements, which are each located between the adjacent electrode elements of the first electrode section, and are held at a predetermined potential.

Specifically, the electrode elements of the first electrode section and those of the third electrode section are alternately disposed. The electrode elements of third electrode section are held at the ground potential, for example. This arrangement of the electrode elements successfully solves the cross talk problem, with prevention of current flow to the adjacent elements.

A number of electrode elements of the first electrode section are electrically isolated by the third electrode section, to effectively prevent the cross talk between the channels, and to make it easy to manufacture the linear photo sensing device.

DETAILED DESCRIPTION OF THE PREFERRED EMBODIMENTS

Figure 5:
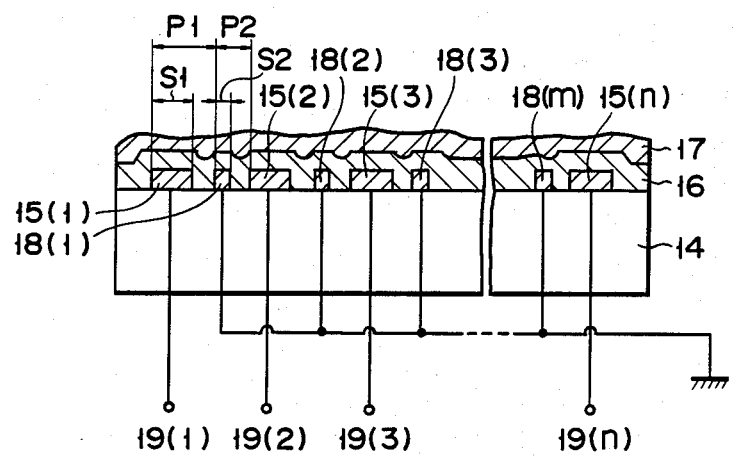
FIG. 5 shows a cross sectional view of a first embodiment of a linear photo sensing device according to the present invention.
Figure 6A:
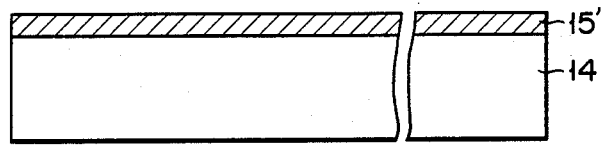
FIGS. 6A to 6D show in cross sectional form a sequence of manufacturing steps for manufacturing the FIG. 5 linear photo sensing device.
Figure 6B:
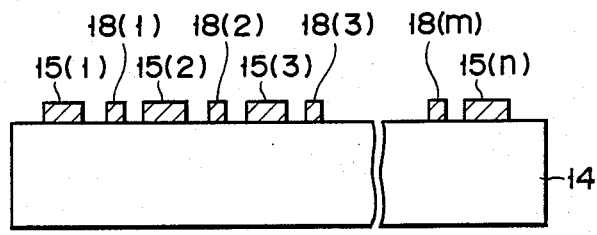
Figure 6C:
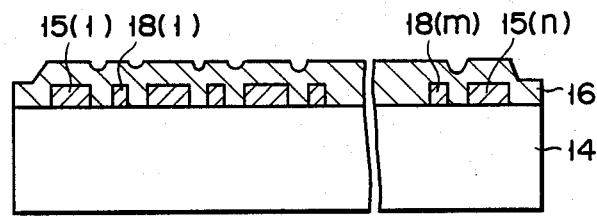
Figure 6D:
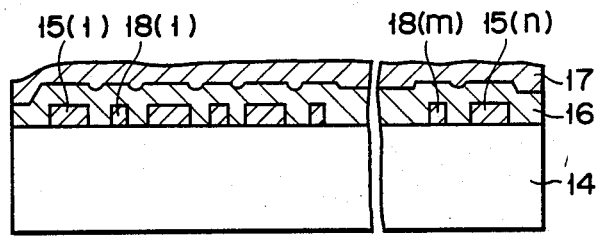

Deference is made to FIG. 5 illustrating the structure of a linear photo sensing device according to a first embodiment of this invention.

First electrode section 15 is formed on glass substrate 14. First electrode section 15 is composed of electrode elements 15(1), 15(2), 15(3),... 15(n) (n=2,000). Third electrode section 18 is also formed on glass substrate 14. The third electrode section 18 is composed of electrode elements 18(1), 18(2), 18(3),... 18(m) where m is n-1, 1,999) which are each disposed between the adjacent electrode elements of the first electrode section. That is to say, those elements of the first and third electrode sections are alternately arranged. In this instance, the pitches P1 and P2, and the lengths S1 and S2 of the electrode elements array of the first and third electrodes are 140 $\mu$m and 60 $\mu$m, and 110 $\mu$m and 30 $\mu$m, respectively.

Amorphous silicon layer 15 is formed covering those first and third electrode sections 15 and 18. The second electrode 17, as a transparent conductive layer made of tin oxide $SnO_2$ is formed covering amorphous silicon layer. The electrode elements 15(1), to 15(n) of the first electrode section 15 are coupled with detecting terminals 19(1), 19(2), 19(3),... 19(n) (n=2,000), respectively. The electrode elements 18(1), to 18(n) of the third electrode 18 are coupled with ground potential, so that they are maintained at the same potential level.

The steps of manufacturing process for the photo sensing device thus arranged will be described referring to FIG. 6.

Step (a) (FIG. 6A): Conductive layer 15' is formed on glass substrate 14 by the well known vapor deposition process or the CVD (chemical vapor deposition) process.

Step (b) (FIG. 6B): The unnecessary portions of the conductive layer 15' laid in step (a) by the photolithography. This step forms the discrete electrode elements 15(1) to 15(n) and 18(1) to 18(n) of the first and third electrodes, which are alternately arrayed. The pitches P1 and P2, and the lengths S1 and S2 in this instance are those as stated earlier.

Step (c) (FIG. 6C): Amorphous silicon layer 16 is formed covering first and third electrode sections 15 and 18 by the known vapor deposition process, the spattering process or the CVD process.

Step (d) (FIG. 6D): Second electrode section 17 is formed covering amorphous silicon layer 16. The section 17 is a transparent conductive layer made of tin oxide $SnO_2$ or indium-tin oxide (ITO). Second electrode 17 can be formed using the known process as described above.

The structure of FIG. 5 can be formed by using the process steps as mentioned above.

The operation and use of the linear photo sensing device will be described.

In the actual use of the linear photo sensing device of FIG. 5, the electrode elements 15(1) to 15(n) and 18(1) to 18(m) of the first and third electrode sections 15 and 18 are held at a fixed potential, e.g., ground potential. Under this condition, the second electrode 17 is irradiated with the light emitted from the side 1b of imaging plate 1. The received light is converted into current by amorphous silicon layer 16. The converted current is output to the electrode element corresponding to the irradiation location of first electrode 15. Presence of the electrode elements 18(1) to 18(n) at the fixed potential between the electrode elements 15(1) to 15(n) electrically separates those elements 15(1) to 15(n). Specifically, the current to flow to both sides of each electrode element in the amorphous silicon 16 is pulled to ground by the adjacent electrodes 18(1) to 18(n). Therefore, the cross talk, which otherwise might occur between the electrode elements 15(1) to 15(n), i.e., the channels, is successfully prevented.

In the structure shown in FIG. 5, of the first electrode section 15, third electrode section 18, amorphous silicon layer 16, and second electrode section 17 formed on glass substrate 14, the portions requiring the partial working are only the first and third electrode sections 15 and 18 as the first layer, and the remaining portions do not require such a working.

Therefore, it is only needed that the photolithography technique is applied to only the formation of first and third electrode sections 15 and 18. This indicates that the patterning with the highest accuracy as allowed in this technique can be used. In the photolithography technique, the order of 5 to 10 $\mu$m can provide the working accuracy with satisfactory reproducibility. In fabricating the first ad third electrode sections 15 and 18, the size of them may be reduced to such minute figure, if necessary. To obtain a high detecting efficiency, it is desirable to set the size (area) of each electrode element of the first electrode section as large as possible. The requirement for third electrode 18 is only to keep the fixed potential. Hence, if its size is small, no problem arises in practical use.

It should be understood that the size figures and the number of pixels are used by way of example, and these may be changed if necessary.

Figure 1:
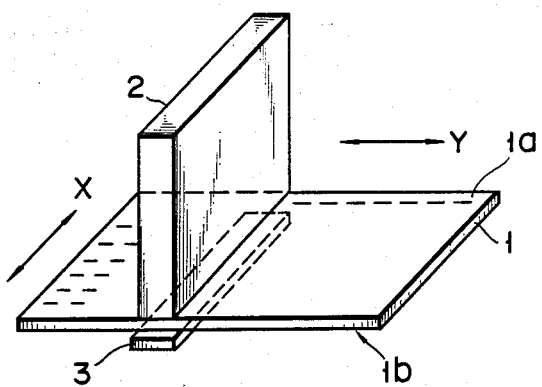
FIG. 1 shows a model of a linear photo sensing device as a reading device in use with the imaging plate.
Figure 2:
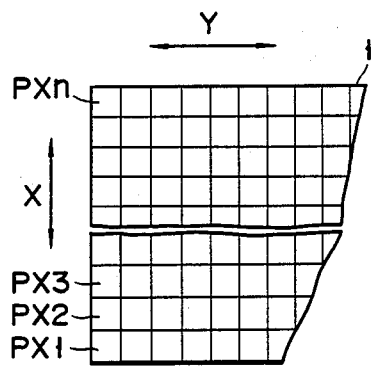
FIG. 2 shows a diagram of an image plate for explaining an array of pixels.
Figure 3:
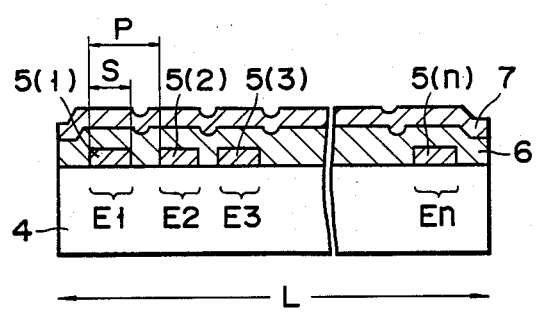
FIG. 3 shows a cross sectional view showing the structure of a conventional linear photo sensing device.
Figure 4:
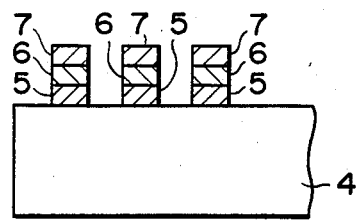
FIG. 4 shows a cross sectional view of an ideal linear photo sensing device.
Figure 7:
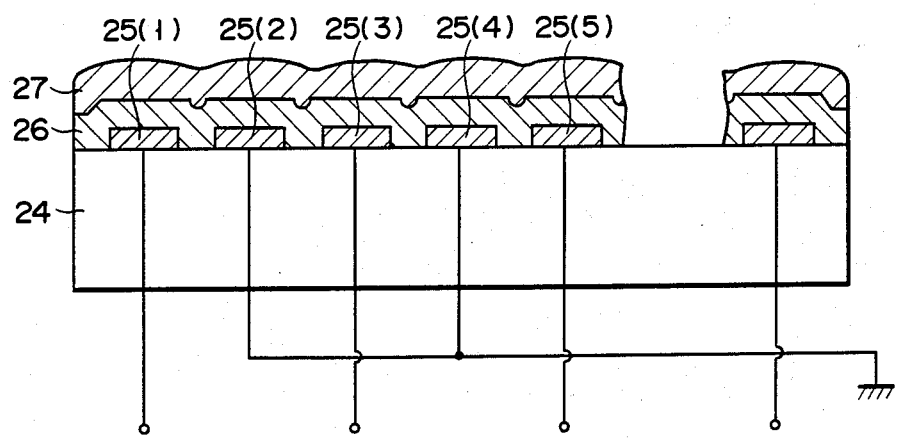
FIG. 7 shows a cross sectional view of a second embodiment of a linear photo sensing device according to the present invention.

A linear photo sensing device according to the second embodiment of this invention will be described referring to FIG. 7. As shown, a number of electrode elements 25(1), 25(2), 25(3), ... of the first layer, amorphous silicon layer 26 as a second layer, and electrode 27 as a third layer are formed on glass substrate, as n the conventional device of FIG. 3. Of those electrode elements, the even numbered electrode elements 25(2), 25(4), ... are held at the ground potential, while the odd numbered electrode elements 25(1), 25(3), ... are connected to the output terminals, and used as a first electrode.

Figure 8:
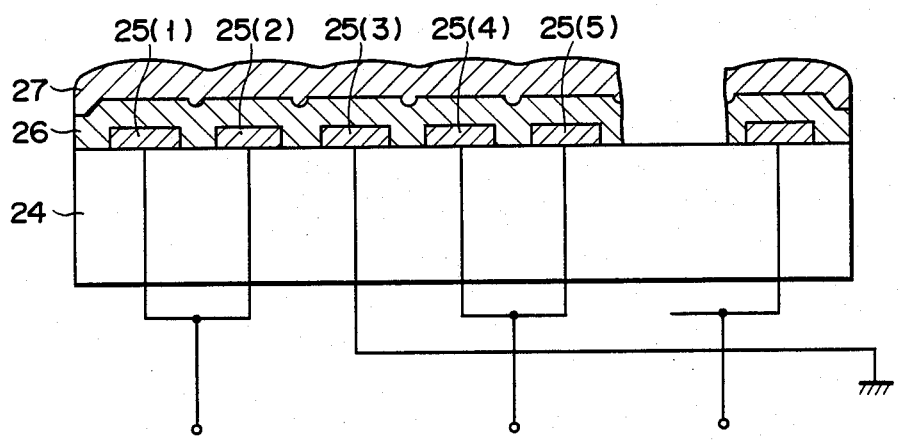
FIG. 8 shows a cross sectional view of a third embodiment of a linear photo sensing device according to the present invention.

A linear photo sensing device according to a third embodiment of this invention is illustrated in FIG. 8. As shown, a number of electrode elements 25(1), 25(2), 25(3), 25(4),... of the first layer, amorphous silicon layer 26 as a second layer, and electrode section 27 as a third layer are formed on glass substrate 24, as in the FIG. 7 device. Of those electrode elements, the electrode elements 25(3), 25(6), ... are held at the ground potential, while the remaining electrode elements 25(1), 25(3), 25(4), 25(5), ... are so arranged that two adjacent electrode elements are paired and connected together, and to the output terminal. These electrode elements 25(1), 25(3), 25(4), 25(5), ... are used as a first electrode section.

Figure 9:
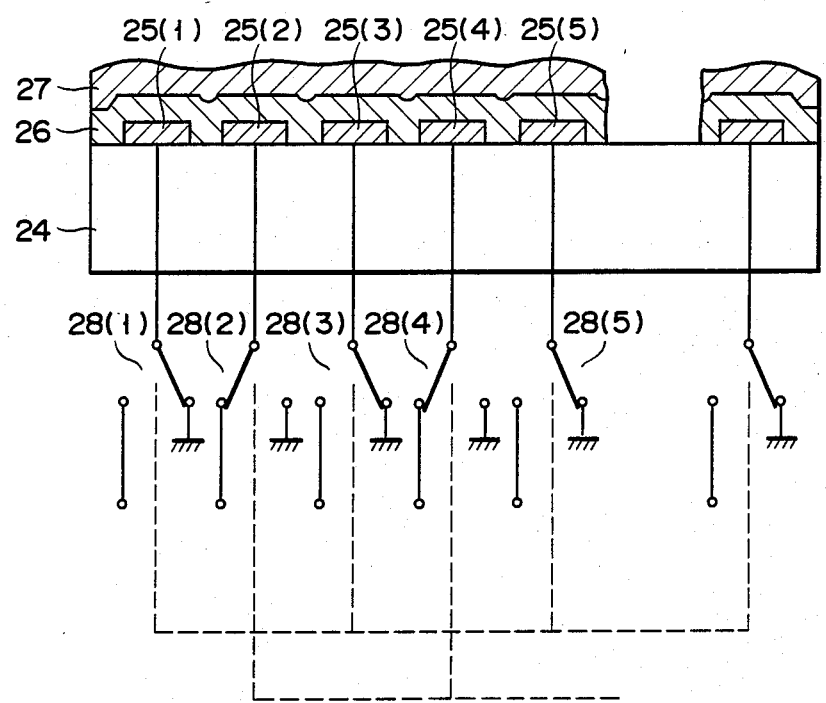
FIG. 9 shows a cross sectional view of a fourth embodiment of a linear photo sensing device according to the present invention.

A linear photo sensing device according to a fourth embodiment of this invention is illustrated in FIG. 9. As shown, a number of electrode elements 25(1), 25(2), 25(3),... of the first layer, amorphous silicon layer 26 as a second layer, and electrode section 27 as a third layer, are formed on glass substrate 24, as in the FIG. 7 device. The electrode elements 25(1), 25(2), 25(3), ... are connected to select switches 28(1), 28(2), 28(3, ..., respectively. These select switches are used for selecting the route of electrode elements 25(1), 25(2), 25(3), ... to ground or that to the output terminal. The odd-numbered select switches 28(1), 28(3), ... constitute a first switch group. The evennumbered select switches 28(2), 28(4), ... constitute a second switch group. In this instance, the effective signal is derived from the signal from the second switch group when the first switch group is grounded, or from the signal from the first switch group when the second switch group is grounded. With this signal, the cross talk from electrode elements 25(1), 25(2), 25(3), ... is eliminated, and additionally the light image detection can be made at a high resolution.

What is claimed is:

1. A linear photo sensing device comprising first linear electrode means having a plurality of linearly-arrayed electrode elements of the same size and shape, second linear electrode means, and a linear semiconductor layer with photoelectric converting function sandwiched between said first and second electrode means, and means for holding every Nth electrode element of said first electrode means at a ground potential, where N is an integer and N>2.

2. The device according to claim 1, in which said second electrode means includes a transparent conductive layer disposed substantially entirely covering one of the major surfaces of said semiconductor layer.

3. A linear photo sensing device comprising:
   a first electrode means including a plurality of linearly arrayed electrode elements including first and second groups of electrode elements, each of said plurality of linearly arrayed electrode elements having an output terminal and a ground terminal;
   a second linear electrode means;
   a linear semiconductor layer having a photoelectric converting function sandwiched between said first and second linear electrode means; and
   switching means for connecting in the alternative either the output terminal or the ground terminal to each of the plurality of linearly arrayed electrode elements, the switching means being operative to connect each of the first group of the plurality of electrode elements to each corresponding output terminal and each of the second group of the plurality of electrode elements to each corresponding ground terminal for deriving an effective signal from the first group, and being operative to connect each of the first group of the plurality of electrode elements to each corresponding ground terminal and each of the second group of the plurality of electrode elements to each corresponding output terminal for deriving an effective signal from the second group of the plurality of electrode elements.

4. The device according to claim 3, wherein each electrode element of the first group is alternately spaced adjacent each electrode element of the second group.

* * * * *